United States Patent
Sassano et al.

(10) Patent No.: US 11,171,450 B2
(45) Date of Patent: Nov. 9, 2021

(54) METHOD AND APPARATUS FOR THE ALIGNMENT AND LOCKING OF REMOVABLE ELEMENTS WITH A CONNECTOR

(71) Applicant: International Business Machines Corporation, Armonk, NY (US)

(72) Inventors: Camillo Sassano, Durham, NC (US); William Risk, San Jose, CA (US); Kevin L. Schultz, Raleigh, NC (US); Michael Vincent DeBole, Poughkeepsie, NY (US); Benjamin Gordon Shaw, San Francisco, CA (US)

(73) Assignee: International Business Machines Corporation, Armonk, NY (US)

( * ) Notice: Subject to any disclaimer, the term of this patent is extended or adjusted under 35 U.S.C. 154(b) by 10 days.

(21) Appl. No.: 16/510,703

(22) Filed: Jul. 12, 2019

(65) Prior Publication Data

US 2021/0013676 A1 Jan. 14, 2021

(51) Int. Cl.
| H01R 13/62 | (2006.01) |
| H01R 13/629 | (2006.01) |
| H01R 33/97 | (2006.01) |
| H01R 43/26 | (2006.01) |
| H01R 13/00 | (2006.01) |

(52) U.S. Cl.
CPC ..... *H01R 13/62977* (2013.01); *H01R 13/005* (2013.01); *H01R 33/97* (2013.01); *H01R 43/26* (2013.01)

(58) Field of Classification Search
CPC ............ H01R 13/62977; H01R 13/005; H01R 43/26; H01R 33/97; G06F 1/187; G11B 33/122

USPC .............. 439/153, 347; 354/538; 361/679.39
See application file for complete search history.

(56) References Cited

U.S. PATENT DOCUMENTS

| 5,125,849 A | 6/1992 | Briggs et al. |
| 5,230,635 A | 7/1993 | Takenouchi et al. |
| 5,335,413 A * | 8/1994 | Yamamoto ............. G01R 31/69 29/593 |

(Continued)

FOREIGN PATENT DOCUMENTS

| CN | 101044658 A | 9/2007 |
| EP | 1361631 A3 | 1/2004 |
| EP | 2033272 A2 | 3/2009 |

OTHER PUBLICATIONS

Sassano et al., U.S. Appl. No. 29/698,686, filed Jul. 18, 2019.

(Continued)

*Primary Examiner* — Hae Moon Hyeon
(74) *Attorney, Agent, or Firm* — Zilka-Kotab, P.C.

(57) ABSTRACT

An apparatus according to one embodiment includes a landing pad having a mating portion configured to mate with a mating feature of a removable element as the removable element approaches the landing pad in a first direction. The apparatus also includes a mount along which the landing pad is movable in a second direction. A lever is positionable between a disengaged position and an engaged position, the lever being coupled to the landing pad for translating the landing pad along the mount in the second direction during movement thereof from the disengaged position toward the engaged position. The first direction is different than the second direction.

20 Claims, 5 Drawing Sheets

(56) References Cited

U.S. PATENT DOCUMENTS

| | | | |
|---|---|---|---|
| 5,391,091 A | 2/1995 | Nations | |
| 5,557,499 A * | 9/1996 | Reiter | G06F 1/184 |
| | | | 312/223.2 |
| 5,672,067 A | 9/1997 | Ryll et al. | |
| 5,701,079 A * | 12/1997 | Yagi | G01R 31/69 |
| | | | 324/538 |
| 5,777,480 A * | 7/1998 | Hatagishi | G01R 31/66 |
| | | | 324/538 |
| 5,831,438 A * | 11/1998 | Okura | G01R 31/69 |
| | | | 324/538 |
| 5,877,622 A * | 3/1999 | Aoyama | G01R 31/69 |
| | | | 324/538 |
| 6,345,995 B1 | 2/2002 | Bigotto et al. | |
| 6,346,007 B2 | 2/2002 | Yokoi | |
| 6,558,176 B1 | 5/2003 | Martin et al. | |
| 6,731,118 B2 * | 5/2004 | Nishino | G01R 31/69 |
| | | | 324/538 |
| 7,126,817 B2 * | 10/2006 | Li | G06F 1/184 |
| | | | 361/679.37 |
| 7,503,390 B2 | 3/2009 | Gomez | |
| 7,695,297 B2 | 4/2010 | Pittenger et al. | |
| 7,789,682 B1 | 9/2010 | Hitchcock et al. | |
| 8,259,441 B2 * | 9/2012 | Chuang | H05K 7/1411 |
| | | | 361/679.31 |
| 2009/0305536 A1 | 12/2009 | Martin | |
| 2015/0064953 A1 | 3/2015 | Iwatani | |

OTHER PUBLICATIONS

IBM, "Power Systems: Planar," IBM, 2014, pp. 1-67.
Wikipedia, "Blind mate connector," Wikipedia, Jul. 19, 2018, 2 pages, retrieved from https://en.wikipedia.org/wiki/Blind_mate_connector.
Non-Final Office Action from U.S. Appl. No. 29/698,686, dated Mar. 17, 2021.

* cited by examiner

METHOD AND APPARATUS FOR THE ALIGNMENT AND LOCKING OF REMOVABLE ELEMENTS WITH A CONNECTOR

BACKGROUND

The present invention relates to aligning and locking removable elements, and more particularly, this invention relates to aligning and locking removable elements with a connector such as a blind-mating connector.

Blind-mating connectors can generally be described as connectors that achieve connection via a sliding or snapping action, where the connectors cannot be readily observed as they are mated. Hence a mechanical system is typically present to ensure that the removable component is guided into the correct position to allow the connectors to mate. Blind-mating connectors often have self-aligning features that allow a small misalignment when mating.

The large majority of scalable computing systems using a multi-processor modular approach based on fixed chassis plus removable enclosures (such as Blade, Flex and iDataPlex products) rely on a chassis-host to guide the enclosures of the modules and align the blind-mating connectors and/or fittings for power, data or cooling.

The sides of the enclosures slide along slots present inside the chassis; clamping or locking mechanisms (e.g., spring loaded or lever-actuated mechanisms) are used on the front of the enclosures to keep it in place.

SUMMARY

An apparatus according to one embodiment includes a landing pad having a mating portion configured to mate with a mating feature of a removable element as the removable element approaches the landing pad in a first direction. The apparatus also includes a mount along which the landing pad is movable in a second direction. A lever is positionable between a disengaged position and an engaged position, the lever being coupled to the landing pad for translating the landing pad along the mount in the second direction during movement thereof from the disengaged position toward the engaged position. The first direction is different than the second direction.

An apparatus according to another embodiment includes a landing pad having a mating portion configured to mate with a mating feature of a removable element as the removable element approaches the landing pad in a first direction. The apparatus also includes a mount along which the landing pad is movable in a second direction toward a connector configured to couple with a second connector of the removable element. A lever is positionable between a disengaged position and an engaged position, the lever being coupled to the landing pad for translating the landing pad along the mount in the second direction during movement thereof from the disengaged position toward the engaged position. The first direction is oriented at an angle from the second direction, the angle being in a range of greater than 0 (>0) degrees to 90 degrees.

A process, performed by various apparatuses described herein, includes receiving a removable element on a landing pad having at least one mating portion configured to mate with a mating feature of the removable element as the removable element approaches the landing pad in a first direction. The landing pad and the removable element mounted thereon are translated along a mount in a second direction toward a connector in response to an external force being applied to a lever which moves the lever from a disengaged position toward an engaged position, the lever being coupled to the landing pad. The first direction is oriented at an angle from the second direction, the angle being in a range of >0 degrees to 90 degrees.

Other aspects and embodiments of the present invention will become apparent from the following detailed description, which, when taken in conjunction with the drawings, illustrate by way of example the principles of the invention.

DETAILED DESCRIPTION

Figure 1A:
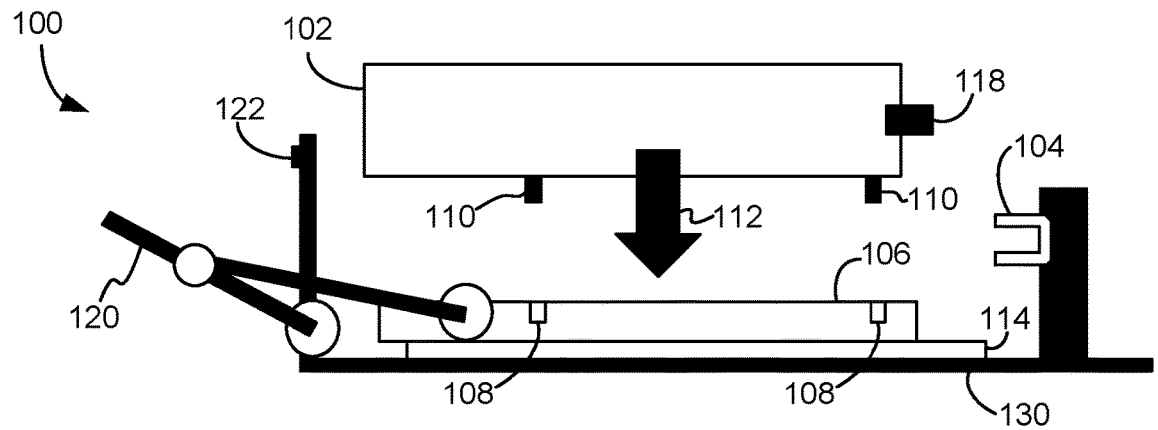
FIGS. 1A-1C are side views of an apparatus in accordance with one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of apparatuses for aligning and locking removable elements with a connector, such as a blind-mating connector, as well as operation and/or component parts of such apparatuses. Prior to the present disclosure, there has been no common solution for aligning removable elements without using four sides to guide them inside a slot, nor for installing removable elements from the top and plugging them in sideways.

In one general embodiment, an apparatus includes a landing pad having a mating portion configured to mate with a mating feature of a removable element as the removable element approaches the landing pad in a first direction. The apparatus also includes a mount along which the landing pad is movable in a second direction. A lever is positionable between a disengaged position and an engaged position, the lever being coupled to the landing pad for translating the landing pad along the mount in the second direction during movement thereof from the disengaged position toward the engaged position. The first direction is different than the second direction.

In another general embodiment, an apparatus includes a landing pad having a mating portion configured to mate with a mating feature of a removable element as the removable element approaches the landing pad in a first direction. The apparatus also includes a mount along which the landing pad is movable in a second direction toward a connector configured to couple with a second connector of the removable element. A lever is positionable between a disengaged position and an engaged position, the lever being coupled to the landing pad for translating the landing pad along the mount in the second direction during movement thereof from the disengaged position toward the engaged position. The first direction is oriented at an angle from the second direction, the angle being any angle in a range of >0 to 90 degrees, preferably in a range of 15 to 90 degrees.

In yet another general embodiment, a process, which can be performed by various apparatuses described herein, includes receiving a removable element on a landing pad having at least one mating portion configured to mate with a mating feature of the removable element as the removable element approaches the landing pad in a first direction. The landing pad and the removable element mounted thereon are translated along a mount in a second direction toward a connector in response to an external force being applied to a lever which moves the lever from a disengaged position toward an engaged position, the lever being coupled to the landing pad. The first direction is oriented at an angle from the second direction, the angle being in a range of >0 to 90 degrees, preferably in a range of 15 to 90 degrees.

Figure 1B:
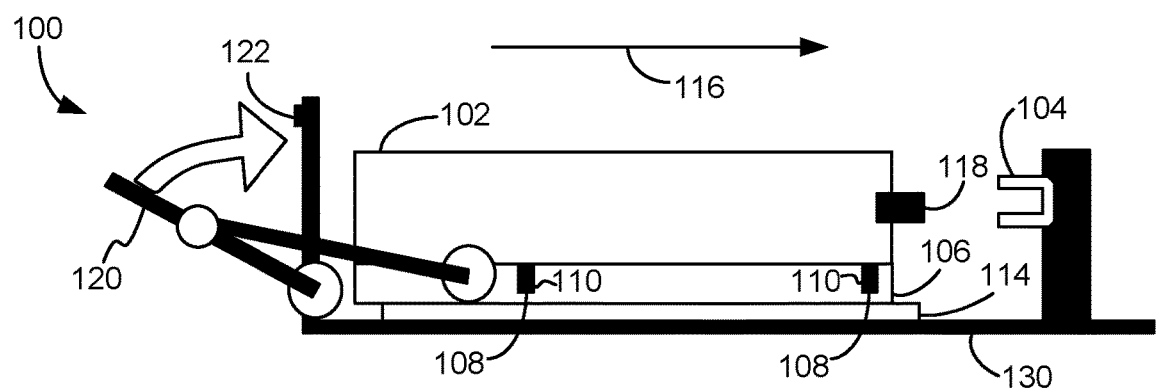
Figure 1C:
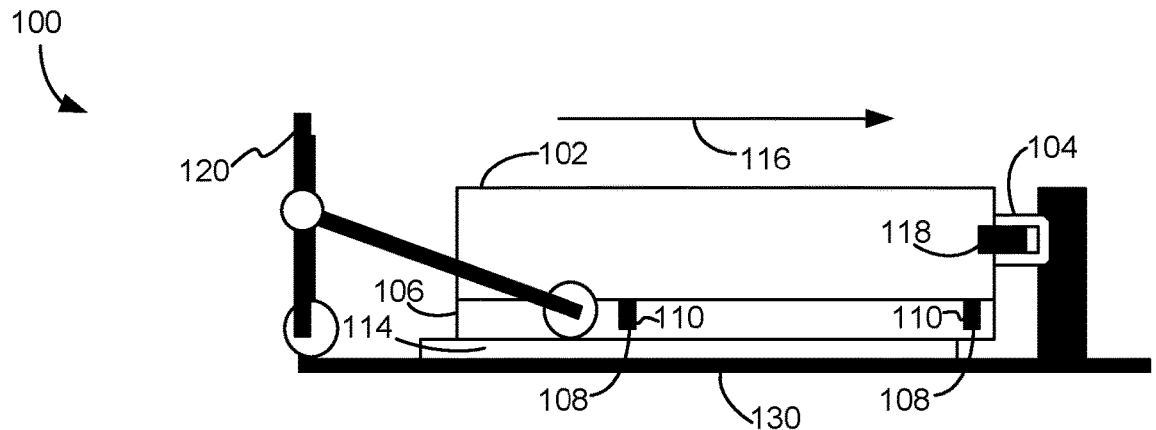

FIGS. 1A-1C depict an apparatus 100 for aligning and locking a removable element 102 in some predefined position, according to one embodiment. The apparatus 100 may simply position the removable element 102 in in a specific location, or align and couple the removable element 102 with something such as a connector 104, and lock the removable element 102 in place e.g., once engaged with the connector 104.

The apparatus 100 includes a landing pad 106 having a mating portion 108, and preferably several mating portions 108, each being configured to mate with a corresponding mating feature 110 of the removable element 102 as the removable element 102 approaches the landing pad 106 in a first direction 112. The mating portion 108 and the mating feature 110 may have any configuration that would become apparent to one skilled in the art upon reading the present disclosure. For example, the mating portion 108 may be a channel, aperture, or other receiving portion configured to receive a pin-type mating feature 110, a loop-type mating feature 110, etc. See, e.g., FIG. 3A-3C for an exemplary pin-type mating feature 110 and channel-type mating portion 108. In other approaches, the mating configuration may be reversed, e.g., the mating feature 110 may be a channel, aperture, or other receiving feature configured to receive a pin-type mating portion 108, a loop-type mating portion 108, etc.

The apparatus 100 includes a mount 114 along which the landing pad 106 is movable in a second direction 116. The second direction 116 is different than the first direction 112, and preferably nonparallel thereto. For example, the first direction 112 may be oriented at an angle from the second direction 116, the angle being in a range of >0 to 90 degrees, preferably in a range of 15 to 90 degrees. In the example shown in FIGS. 1A-1C, the first direction 112 is about orthogonal to the second direction 116.

The apparatus 100 may be configured to move the removable element 102 toward a connector 104. The connector 104, while generally not considered part of the apparatus 100 in most embodiments, is configured to couple with a second connector 118 of the removable element 102. The connectors 104, 118 may be any known types of connectors. In preferred embodiments, one or both of the connector and the second connector are blind-mating connectors.

In some approaches, the connectors 104, 118 include cooperating electrical connectors of any type, e.g., conventional blind-mating electrical connectors. The electrical connectors may be used, for example, to provide power to the removable element 102; connect the removable element 102 to another circuit, computer, etc.; etc.

In other approaches, the connectors 104, 118 include cooperating fluid fittings of any type, e.g., conventional blind-mating fluid fittings. The fluid fittings may be used, for example, to provide coolant to the removable element 102, etc.

In further approaches, the connectors 104, 118 include both cooperating electrical connectors and cooperating fluid fittings. Moreover, each connector 104, 118 may include multiple electrical and/or fluidic coupling components.

The apparatus 100 includes a lever 120 positionable between a disengaged position as shown in FIG. 1A and an engaged position as shown in FIG. 1C. The lever 120 is detachably or fixedly coupled to the landing pad 106, e.g., via a connecting rod, gear, etc., for translating the landing pad 106 along the mount 114 in the second direction 116 during movement of the lever 120 from the disengaged position toward the engaged position, as exemplified by the transition shown from FIG. 1A to 1C. The translation of the landing pad 106 in the second direction 116 as the lever 120 is moved toward the engaged position causes the connectors 104, 118 to become coupled Likewise, a movement of the lever 120 to translate the landing pad 106 in an opposite direction as the second direction 116 causes the connectors 104, 118 to become uncoupled.

In preferred embodiments, the apparatus 100 is configured to lock both the landing pad 106 and the removable element 102 in place upon translation of the landing pad 106 toward the connector 104, e.g., upon movement of the lever 120 from the disengaged position to the engaged position Likewise, a movement of the lever 120 to translate the landing pad 106 in an opposite direction as the second direction 116 unlocks the removable element 102, and possibly unlocks the landing pad 106 thereby allowing its removal from the mount 114.

Figure 2:
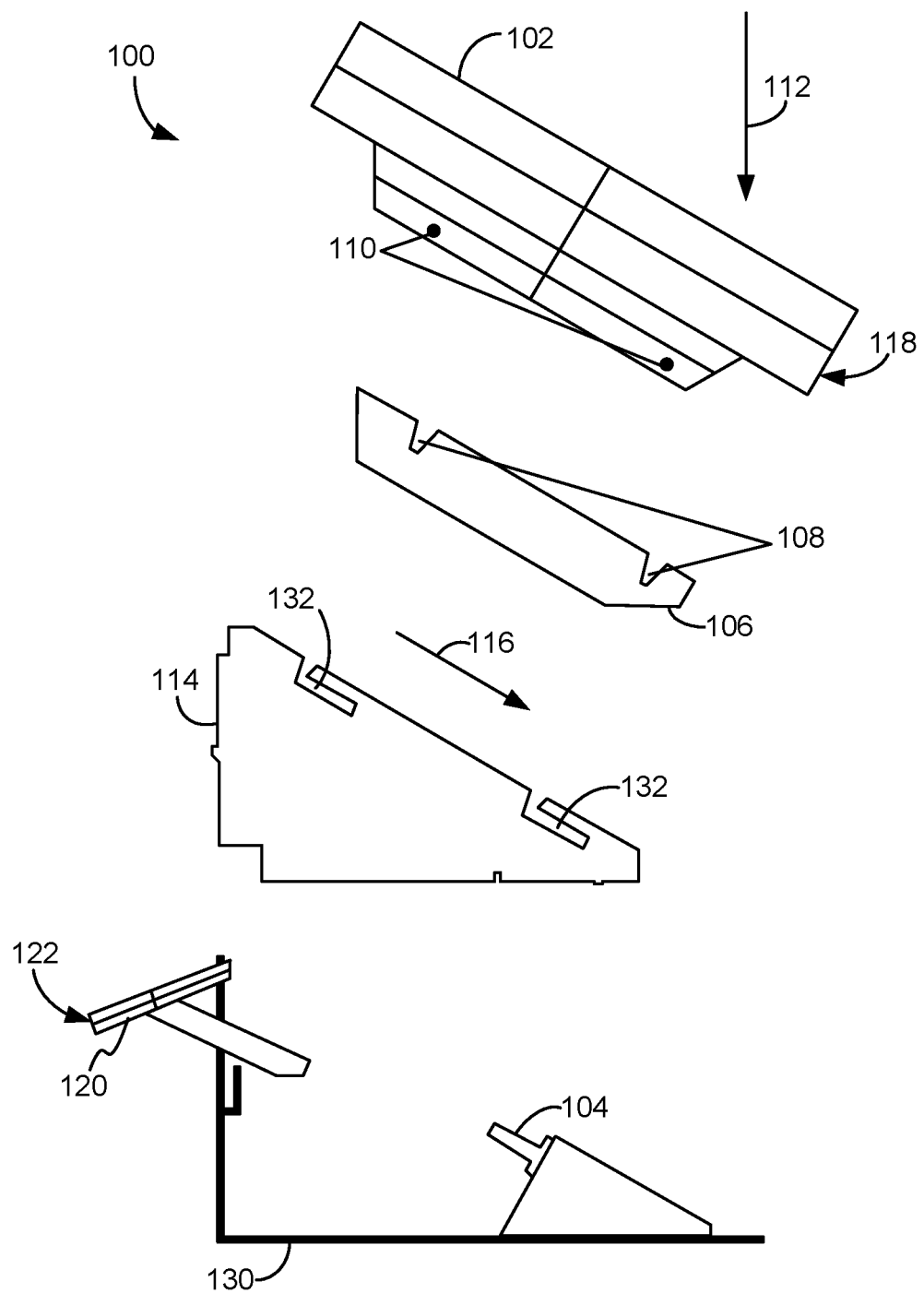
FIG. 2 is an exploded view of an exemplary apparatus in accordance with one embodiment.
Figure 3C:
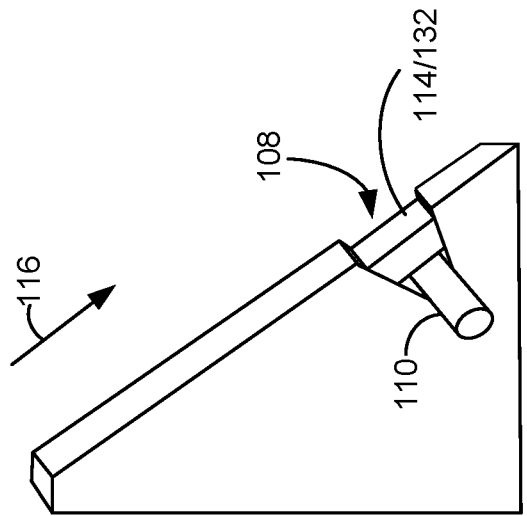
FIGS. 3A-3C are representative views depicting the interaction between the mating portion of the landing pad and the mating feature of the removable element of the apparatus depicted in FIG. 2.

In one approach, the mount 114 has a locking feature for locking the mating feature 110 of the removable element 102 to the mount 114 when the mating feature 110 is mated with the mating portion 108 of the landing pad 106 and the landing pad 106 is moved in the second direction 116. Any type of locking feature that would become apparent to one skilled in the art upon reading the present disclosure may be used. For example, some approaches may use known locking features. FIGS. 2-3C, discussed in more detail below, depict an illustrative mount 114 having a locking feature.

A secondary lock 122 for selectively locking the lever 120 in the engaged position may be present. Any type of secondary lock 122 that would become apparent to one skilled in the art upon reading the present disclosure may be used. Illustrative secondary locks 122 include latches, hooks, catches, etc.

The apparatus 100 may be used in any environment that would become apparent to one skilled in the art upon being apprised of the present disclosure. As shown in FIGS. 1A-1C, the apparatus 100 may be located in a chassis 130. The chassis 130 can be any type of support, structure, enclosure, etc., such as a computer rack, a rack for data storage drives, a vehicle, etc. Moreover, in various approaches, several apparatuses 100 may be present in chassis 130, e.g., in a common bay of the chassis 130, in multiple bays of the chassis 130, etc.

The mount 114 may be detachably and/or fixedly coupled to the chassis 130 using any known coupling mechanism. The connector 104 may be coupled to the chassis 130 using any known coupling mechanism. Illustrative coupling mechanisms usable in this and other embodiments include threaded fasteners, rivets, adhesives, snap fittings, etc.

FIG. 2 depicts an example of an apparatus 100 according to one embodiment. As an option, the exemplary apparatus 100 of FIG. 2 may be implemented in conjunction with features from any other embodiment listed herein, such as those described with reference to the other FIGS. Of course, however, such apparatus 100 and others presented herein may be used in various applications and/or in permutations which may or may not be specifically described in the illustrative embodiments listed herein. Further, the apparatus 100 presented herein may be used in any desired environment.

As shown in FIG. 2, the landing pad 106 includes a channel-like mating portion 108 that receives pin-like mating features 110 of the removable element 102. The landing pad 106 is configured to slide along the mount 114 in the second direction 116 and in the reverse direction of second direction 116 as the lever 120 is actuated. The mount 114 has locking features 132 which, as described below with reference to FIGS. 3A-3C, lock the mating features 110 of the removable element 102 to the apparatus 100 once the landing pad 106 begins motion in the second direction 116.

Figure 3B:
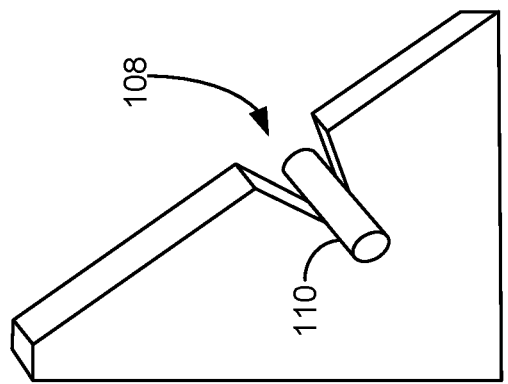
Figure 3A:
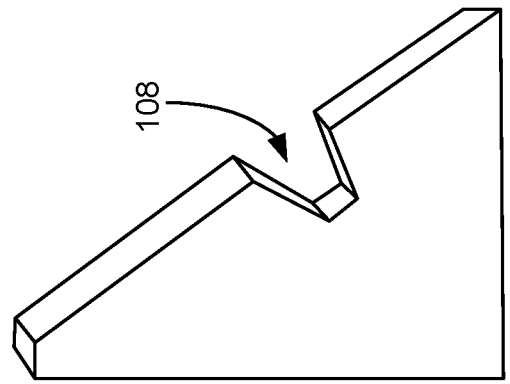

FIGS. 3A-3C depict the interaction between the mating portion 108 of the landing pad 106 and the mating feature 110 of the removable element 102 of the apparatus 100 depicted in FIG. 2. Particularly, FIG. 3A illustrates the mounting portion of the landing pad 106. FIG. 3B illustrates engagement of the mating feature 110 of the removable element 102 with the mounting portion of the landing pad 106. When the removable element 102 is placed on the landing pad 106 and the lever 120 is operated, the landing pad 106 starts translating in the second direction 116, and the locking feature 132 clamps the mating feature 110 in place, so the removable element 102 is secured during translation. FIG. 3C illustrates the locking feature 132 of the mount 114 locking the mating feature 110 of the removable element 102 to the apparatus 100 after the landing pad 106 has been translated in the second direction 116. This position also locks the landing pad 106 to the mount 114.

Figure 4:
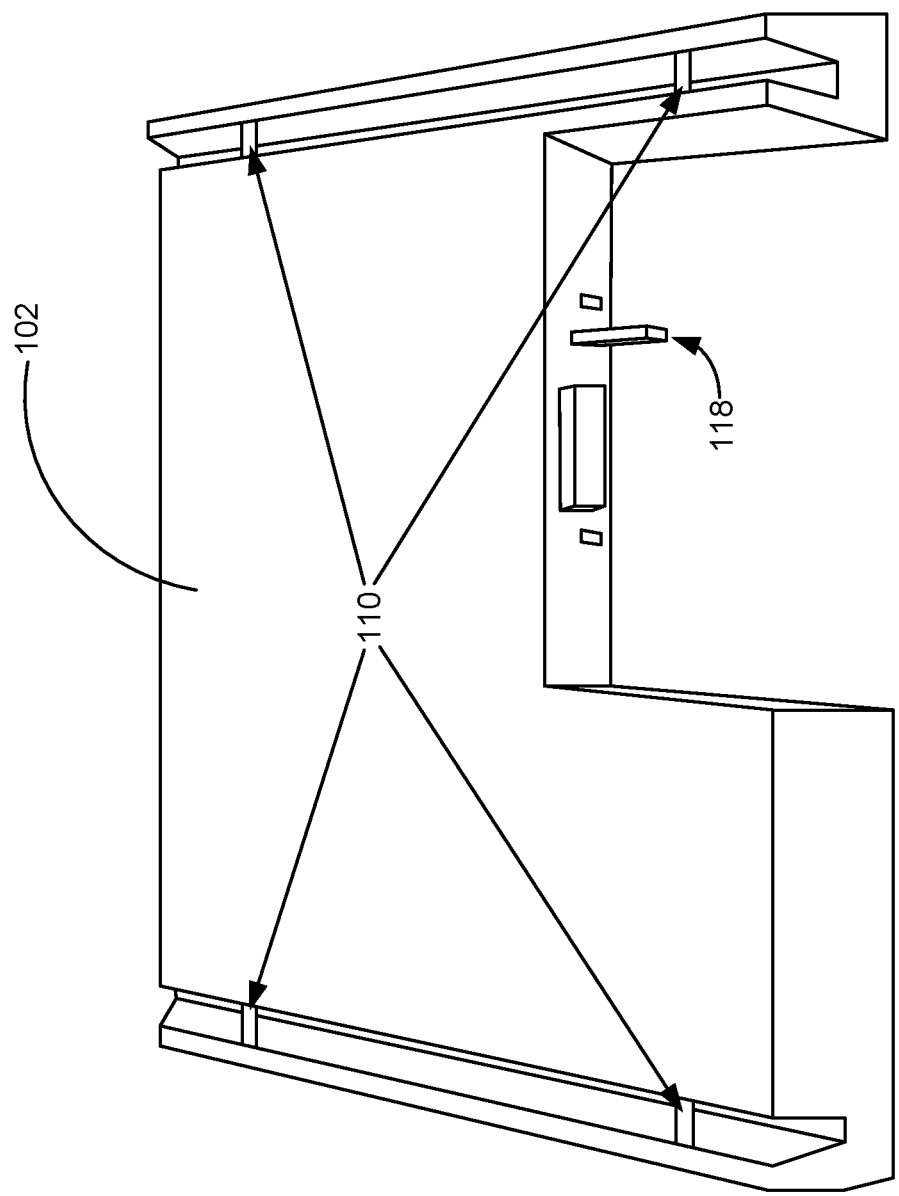
FIG. 4 is a perspective view of a removable element that is usable with the apparatus depicted in FIG. 2.

FIG. 4 is a perspective view of the underside of the removable element 102 shown in FIG. 2. As shown, the removable element 102 includes four mating features 110 and the connector 118.

Figure 5:
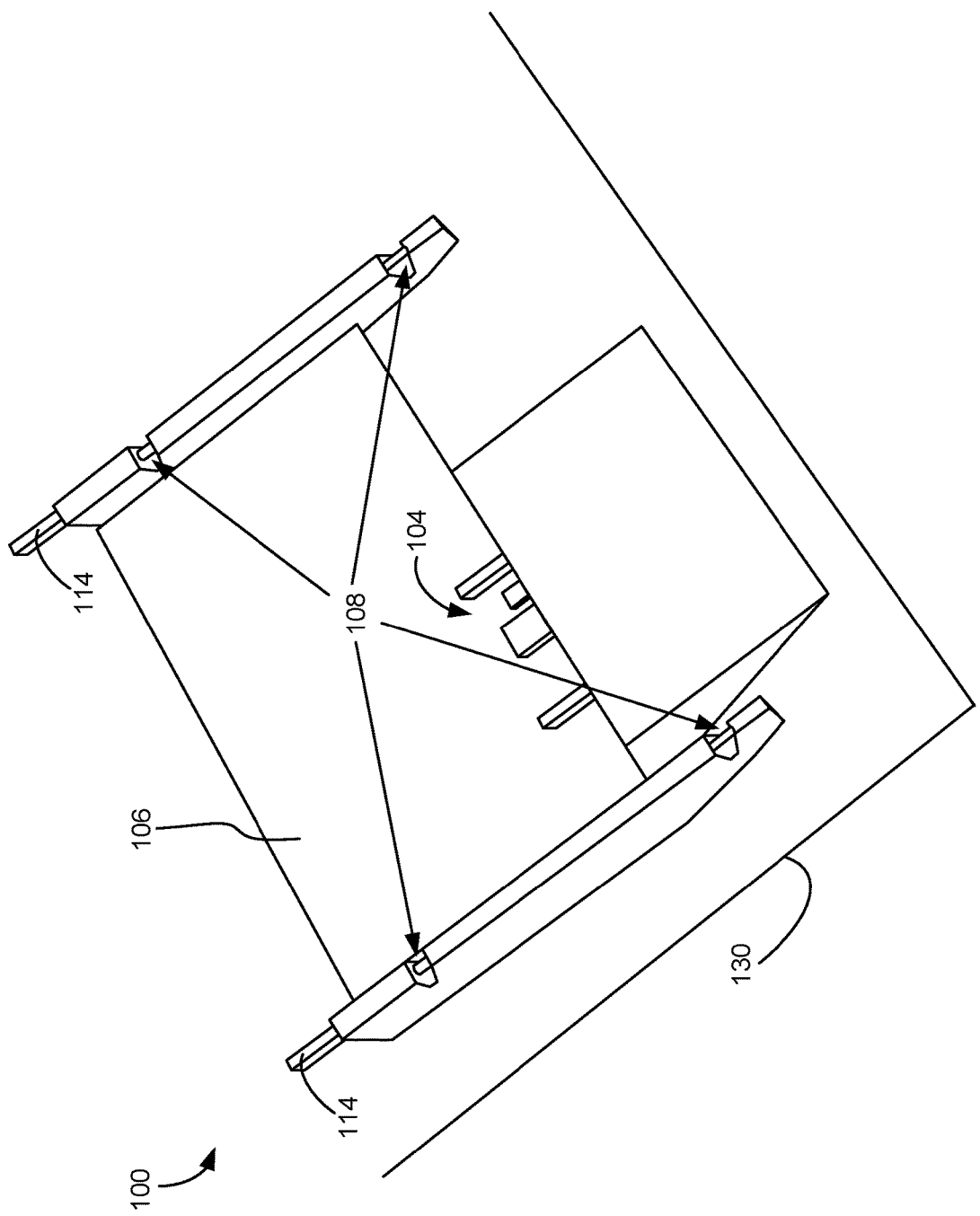
FIG. 5 is a perspective view of the apparatus depicted in FIG. 2.

FIG. 5 is a perspective view of the apparatus 100 of FIG. 2. As shown, the landing pad 106 includes four mating portions 108 for mating with the mating features 110 shown in FIG. 4. The landing pad 106 is shown in the engaged position. The connector 104 and the underlying chassis 130 is also shown. The removable element 102 of FIG. 4 may be inverted from the position shown in FIG. 4 and placed onto the landing pad 106.

In use, a process performed by one or more of the apparatuses as described herein includes receiving a removable element on the landing pad, which again has at least one mating portion configured to mate with a mating feature of the removable element as the removable element approaches the landing pad in the first direction. The landing pad and the removable element mounted thereon are translated along a mount in a second direction, e.g., toward a connector, in response to an external force (such as a user operating a lever) being applied to the lever, which moves the lever from a disengaged position toward an engaged position. The lever is coupled to the landing pad. The first direction is different than the second direction, and is preferably oriented at an angle from the second direction, the angle being in a range of >0 to 90 degrees.

As noted above, the apparatus preferably locks both the landing pad and the removable element in place upon translation of the landing pad toward the connector.

As also noted above, a secondary lock is preferably engaged for selectively locking the lever in the engaged position in response to the lever entering the engaged position.

It will be clear that the various features of the foregoing systems and/or methodologies may be combined in any way, creating a plurality of combinations from the descriptions presented above.

It will be also appreciated that embodiments of the present invention may be provided in the form of a service deployed on behalf of a customer.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus, comprising:
   a landing pad having a mating portion configured to mate with a mating feature of a removable element as the removable element approaches the landing pad in a first direction;
   a mount along which the landing pad is movable in a second direction; and
   a lever positionable between a disengaged position and an engaged position, the lever being coupled to the landing pad, the lever being configured to translate the landing pad along the mount in the second direction during movement thereof from the disengaged position toward the engaged position,
   wherein the first direction is different than the second direction,
   wherein the apparatus is configured to lock both the landing pad and the removable element in place upon translation of the landing pad toward a connector configured to couple with a second connector of the removable element,
   wherein the connectors include cooperating fluid fittings that are configured to provide a fluid to the removable element.

2. The apparatus as recited in claim 1, wherein the cooperating fluid fittings are configured to provide coolant to the removable element.

3. The apparatus as recited in claim 1, wherein the cooperating fluid fittings are blind-mating fluid fittings.

4. An apparatus, comprising:
   a landing pad having a mating portion configured to mate with a mating feature of a removable element as the removable element approaches the landing pad in a first direction;
   a mount along which the landing pad is movable in a second direction; and a lever positionable between a disengaged position and an engaged position, the lever being coupled to the landing pad, the lever being configured to translate the landing pad along the mount in the second direction during movement thereof from the disengaged position toward the engaged position, wherein the first direction is different than the second direction, wherein the mount has a locking feature configured to lock the mating feature of the removable element to the mount when the mating feature is mated with the mating portion of the landing pad and the landing pad is moved in the second direction, wherein the locking feature of the mount is configured to remain stationary and prevent movement of the mating feature in the first direction while permitting movement of the mating feature in the second direction.

5. The apparatus as recited in claim 4, wherein the first direction is oriented at an angle from the second direction, the angle being in a range of greater than 0 degrees to 90 degrees.

6. The apparatus as recited in claim 4, wherein the first direction is about orthogonal to the second direction.

7. The apparatus as recited in claim 4, wherein the apparatus is configured to lock both the landing pad and the removable element in place upon translation of the landing pad toward a first connector configured to couple with a second connector of the removable element.

8. The apparatus as recited in claim 7, wherein the first and second connectors include cooperating electrical connectors.

9. The apparatus as recited in claim 8, wherein the first and second connectors further include cooperating fluid fittings.

10. The apparatus as recited in claim 4, comprising a lock configured to selectively lock the lever in the engaged position.

11. The apparatus as recited in claim 4, comprising a chassis and a connector coupled to the chassis, the mount being coupled to the chassis.

12. The apparatus as recited in claim 11, wherein the chassis is a rack configured to hold data storage drives.

13. The apparatus as recited in claim 4, wherein the apparatus is configured to lock both the landing pad and the removable element in place upon translation of the landing pad toward a connector configured to couple with a second connector of the removable element, wherein the connectors include cooperating fluid fittings.

14. The apparatus as recited in claim 4, wherein the locking feature of the mount directly engages the mating feature of the removable element for locking the mating feature of the removable element to the mount.

15. An apparatus, comprising:

a landing pad having a mating portion configured to mate with a mating feature of a removable element as the removable element approaches the landing pad in a first direction;

a mount along which the landing pad is movable in a second direction toward a connector configured to couple with a second connector of the removable element; and a lever positionable between a disengaged position and an engaged position, the lever being coupled to the landing pad, the lever being configured to translate the landing pad along the mount in the second direction during movement thereof from the disengaged position toward the engaged position, wherein the first direction is oriented at an angle from the second direction, the angle being in a range of 15 degrees to 85 degrees.

16. The apparatus as recited in claim 15, wherein the angle is in a range of 15 degrees to 75 degrees.

17. The apparatus as recited in claim 15, wherein the apparatus is configured to lock both the landing pad and the removable element in place upon translation of the landing pad toward the connector.

18. The apparatus as recited in claim 17, wherein the mount has a locking feature configured to lock the mating feature of the removable element to the mount when the mating feature is mated with the mating portion of the landing pad and the landing pad is moved in the second direction.

19. The apparatus as recited in claim 15, wherein the connectors include cooperating electrical connectors and cooperating fluid fittings.

20. The apparatus as recited in claim 15, comprising a secondary lock configured to selectively lock the lever in the engaged position.

* * * * *